United States Patent [19]

Shih

[11] Patent Number: 5,773,196
[45] Date of Patent: Jun. 30, 1998

[54] PREVENTION OF ANTI-REFLECTION COATING DAMAGE

[75] Inventor: Tsu Shih, Changwa, Taiwan

[73] Assignee: Taiwan Semiconductor Manufacturing Company, Ltd., Hsin-Chu, Taiwan

[21] Appl. No.: 684,806

[22] Filed: Jul. 22, 1996

[51] Int. Cl.$^6$ .................................................. G03F 7/00
[52] U.S. Cl. .......................................... 430/313; 430/318
[58] Field of Search .............................. 430/5, 311, 312, 430/313, 318

[56] References Cited

U.S. PATENT DOCUMENTS 4,962,061  10/1990  Takata ..................................... 437/195
5,270,255  12/1993  Wong ...................................... 437/194

*Primary Examiner*—Kathleen Duda
*Attorney, Agent, or Firm*—George O. Saile; Stephen B. Ackerman

[57] ABSTRACT

An improved integrated circuit device with a reduced metal edge step height at the scribe line region edge and improved anti-reflection coating integrity is produced. This is accomplished by modification of the requisite photomask patterns used in circuit manufacture to provide an opaque region where the scribe line region is to be located, and an additional photomask pattern and photolithographic process to be employed after final metallization to render the scribe line region free of metallic or other material for eventual clean separation of the circuit die.

4 Claims, 2 Drawing Sheets

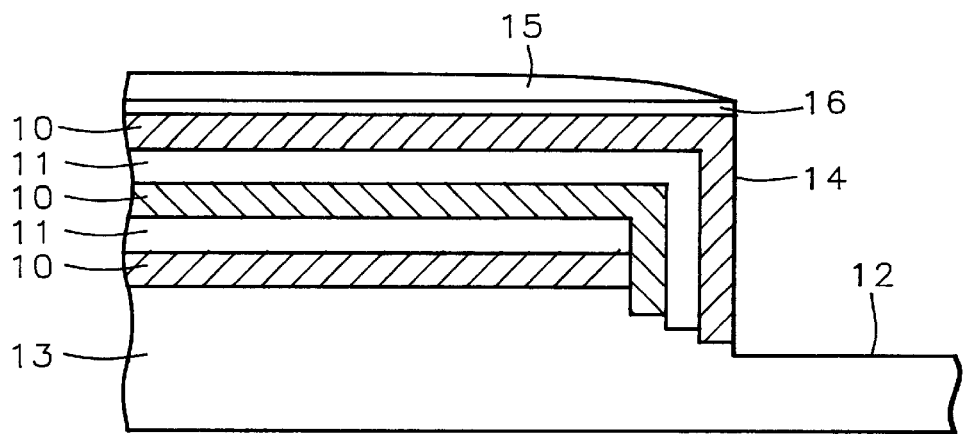
FIG. 1 – Prior Art
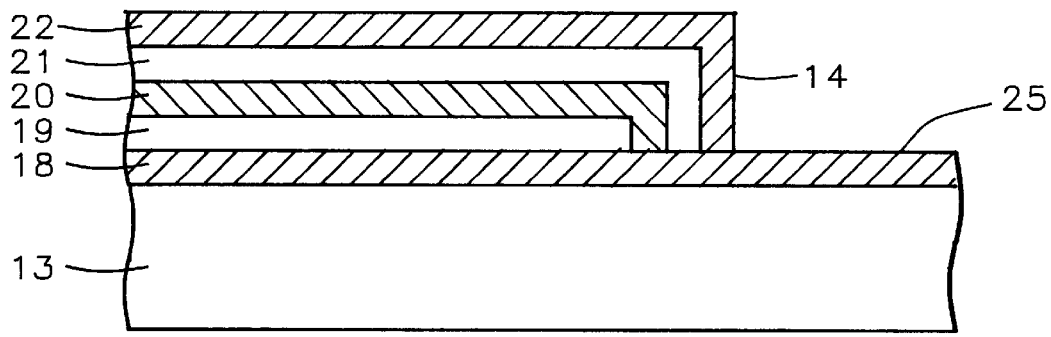
FIG. 2a
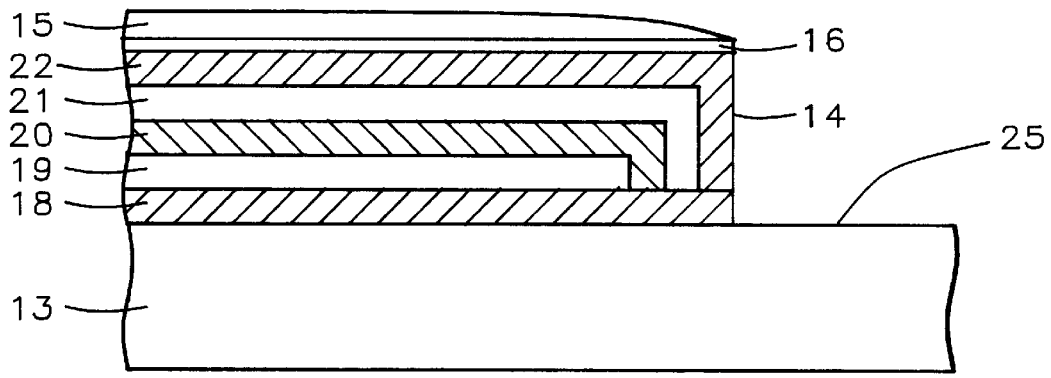
FIG. 2b

PREVENTION OF ANTI-REFLECTION COATING DAMAGE

BACKGROUND OF THE INVENTION (1) Field of the Invention

The invention relates to a method of photolithographic pattern generation in the manufacture of semiconductor integrated circuits which produces an improved step height feature in the etching of metal and other patterns, leading to higher yield and improved reliability of the integrated circuit.

(2) Description of the Prior Art

The generation of photolithographic patterns used in the fabrication of semiconductor integrated circuits includes the provision of a border around the periphery of the integrated circuit cell area. This border is known as a scribe line region, and is the region of the semiconductor where the material is cut or scribed to separate the individual dice after fabrication and testing of the circuits is completed. The scribe line region is delineated by leaving a clear area where the line is to be located on the reticle or photomask so that the positive resist is exposed and will be developed away. Hence this scribe area is opened to subsequent subtractive etching steps that are used to form the patterns required to construct the integrated circuit. In the case of multiple metal and other layers, the repeated etching of the patterns in the scribe area results in a step composed of multiple superimposed edges. This step is often difficult for the final photoresist to cover without excessive thinning at the edge. For example, in a typical fabrication sequence the antireflection coating deposited over the final metal layer may have such a thin coating of photoresist over the edge of this step that the etching of the antireflection coating will also produce pinholes where the photoresist is insufficient to mask the coating at the step. Methods have been described for eliminating or minimizing edges and steps in the fabrication of integrated circuits, particularly in the case of alignment marks. Thus, in U.S. Pat. No. 5,270,255 to Wong a method is described for filling in the steps of alignment marks by sputtering and hot deposition of materials such as aluminum, but the problem of scribe marks and thin photoresist coverage is not addressed. Likewise, complex photolithographic schemes involving positive and negative resists and multiple exposure, development, and etching steps are known, but are uneconomical in practice.

SUMMARY OF THE INVENTION

A principal object of the present invention is to provide an improved method for photolithographic pattern formation of antireflection coatings used in the fabrication of semiconductor integrated circuits. The improvement results in greater integrity of the antireflection coating and higher yield in integrated circuit manufacture. It is a further object of the invention to produce an improved integrated circuit device structure of multiple metal, insulator, and other layers used in the fabrication of integrated circuits with reduced metal edge step height at the periphery of the integrated circuit cell, resulting in higher yield in manufacturing and greater reliability.

In accordance with the objects of this invention, an improved integrated circuit device with a reduced metal edge step height at the scribe line region edge and improved anti-reflection coating integrity is produced. This is accomplished by modification of the requisite photomask patterns used in circuit manufacture to provide an opaque region where the scribe line is to be located, and an additional photomask pattern and photolithographic process after final metallization to render the scribe line region free of material for eventual clean die separation.

BRIEF DESCRIPTION OF THE DRAWINGS

FIG. 1 is a schematic cross-sectional diagram of a portion of an integrated circuit device of the prior art;

FIG. 2a–b is a schematic cross-sectional diagram of a portion of an integrated circuit device of the current invention showing a first embodiment;

DESCRIPTION OF THE PREFERRED EMBODIMENTS

Figure 3A:
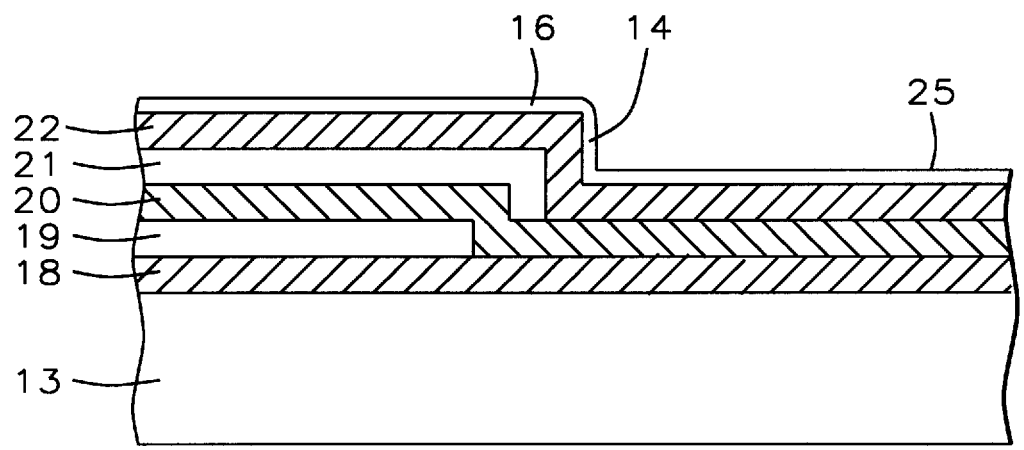
FIG. 3a–b is a schematic cross-sectional diagram of a portion of an integrated circuit device of the current invention, showing a second embodiment.

Referring now more particularly to FIG. 1, there is shown a schematic cross-sectional diagram of a portion of an integrated circuit device near the edge of the circuit cell, which edge is the inner boundary of the scribe line where the separation of the semiconductor die containing the circuit occurs, according to the prior art. Each layer of metal 10 and insulation 11 is successively deposited, coated with a light-sensitive photoresist, exposed and developed to form the desired pattern, and subtractively etched. At each step, the photomask has a clear region at the periphery of the pattern where the scribe line is to be located. This scribe line 12 is the place where the semiconductor will be separated into individual dies or chips containing the individual integrated circuits. The clear peripheral region of the photomask assures that the corresponding exposed photosensitive material is removed upon pattern development, thus unmasking the material for removal during subtractive etching of the pattern. Thus, for example, when a metal layer 10 is subtractively etched, the metal in the scribe line area is also removed. Furthermore, it is common practice to overetch the metal and other pattern to assure complete pattern definition, and this tends to remove some of the underlying semiconductor 13 as well in the scribe line region. This sequence of operations is more or less repeated for the upper metal layers 10 and the insulator layers 11. The final result of these steps is the generation of a steep edge after final metallization and patterning 14, due to successive removal steps of the semiconductor material 13 by photoresist stripping as well as to the superposition of the various metal and insulator layers at the scribe line edge. The steepness of the edge may lead to difficulty in subsequent steps where, for example, coverage by a photoresist layer 15 for subsequent processing of an antireflection coating 16 (ARC) of titanium nitride deposited on the final metal layer 10 is desired.

Referring now more particularly to FIG. 2a, the device of the current invention is depicted schematically in cross-sectional view at the scribe line edge. The metal layer 18 has been subtractively etched where desired, but the photomask pattern employed for this purpose has been left opaque to the exposing radiation in the scribe line region, hence the photoresist there has not been exposed or developed. Thus the metal layer has been left intact in the scribe line region 25. Likewise, the underlying semiconductor substrate material has not been affected by any of the etching or stripping steps. Subsequent processing of the upper metal layers 20 and 22 and the insulator layers 19 and 21 by conventional means do not remove the metal layer 18 or the underlying semiconductor 13 in the scribe line region 25. The resulting device has a much less steep edge at the scribe line and is more easily processed with, for example, a subsequent photoresist application .

In order to be able to separate the individual circuit dies, the scribe line region must be free of any material other than the semiconductor. Therefore, the metal layer 18 must be removed from the scribe line area 25 as shown in FIG. 2b. This is done by an additional photoresist application over the circuit and an exposure through an additional mask which is clear in the scribe line region. Upon development of the exposed resist, the exposed metal in the scribe line region is etched away to provide a clean surface 26 for scribing and separating the die.

The reduction of the steepness of the edge of the device in the vicinity of the scribe line edge is of particular significance in improving the integrity of any layer deposited subsequent to the final metallization layer 22. It is common practice to employ an antireflection coating (ARC) thereon, such as titanium nitride 16. The integrity of this ARC layer is improved if the photoresist mask 15 employed for etching of the final metal layer 22 does not have to cover such a steep edge.

Figure 3B:
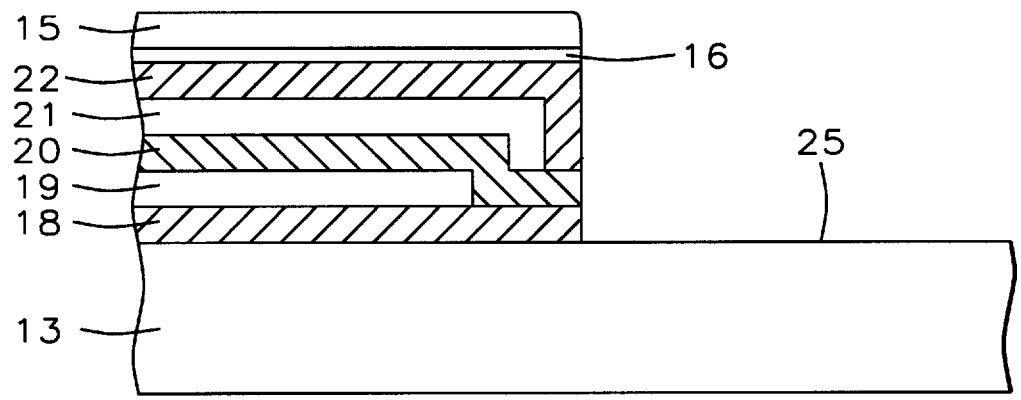

Referring now more particularly to FIG. 3, there is shown a schematic cross-sectional diagram of a portion of an integrated circuit near the edge of the scribe line region, which illustrates another embodiment of the current invention. In this case, an opaque region is incorporated in the photomask patterns of both metallization layers in the scribe line region. Subsequent processing of the two layers of metal 18 and 20 result in an even greater reduction of the metal edge step height in the vicinity of the scribe line region edge, as shown in FIG. 3a. Subsequent application of an additional photomask with a clear region in the scribe line region to expose a photoresist layer and its development is followed by subtractive etching of the combined layers 18, 20, and 22. This results in a scribe line region 25 free of residual material, shown in FIG. 3b, substantially equivalent to the result shown in FIG. 2b. It can be seen from FIG. 3a that in this case the steepness of the metal step height edge is greatly reduced over the prior art, and is reduced over that obtained in the first embodiment (FIG. 2a). This improvement is obtained at the expense of modification of a second photomask and the requirement to subtractively etch a greater thickness of metal in the scribe line region.

While the invention has been particularly shown and described with reference to the preferred embodiments thereof, it will be understood by those skilled in the art that various changes in in form and details may be made without departing from the spirit and scope of the invention.

What is claimed is:

1. A method for the manufacture of an integrated circuit, comprising the steps of:

providing a semiconductor substrate having a cell region and a scribe line region;

forming alternating layers of metal and insulating materials over said cell region and said scribe line region;

leaving said metal layers over said scribe line region, but removing said insulating materials from over said scribe line region after deposition of each said layer of insulating material;

depositing at least one anti-reflective coating over a final metal layer;

photolithographically patterning said anti-reflective coating, whereby said metal layers in said scribe line region reduce step height between said cell region and said scribe line region preventing damage to said anti-reflective coating; and subsequent to patterning said anti-reflective coating, removing said metal layers from over said scribe line region.

2. The method of claim 1 wherein said anti-reflective coating comprises titanium nitride (TiN).

3. A method for the manufacture of an integrated circuit, comprising the steps of:

providing a semiconductor substrate having a cell region and a scribe line region;

forming alternating layers of metal and insulating materials over said cell region and said scribe line region;

leaving at least the first of said metal layers over said scribe line region, but removing said insulating materials from over said scribe line region after deposition of each said layer of insulating material;

depositing an anti-reflective coating over a final metal layer;

photolithographically patterning said anti-reflective coating, whereby said metal layers in said scribe line region reduce step height between said cell region and said scribe line region preventing damage to said anti-reflective coating; and subsequent to patterning said anti-reflective coating, removing said metal layers from over said scribe line region.

4. The method of claim 3 wherein said anti-reflective coating comprises titanium nitride (TiN).

* * * * *